United States Patent
Svensson et al.

(10) Patent No.: US 10,182,495 B2
(45) Date of Patent: Jan. 15, 2019

(54) GROUND TERMINAL FOR AN ELECTRONIC DEVICE

(71) Applicant: Axis AB, Lund (SE)

(72) Inventors: Sven Svensson, Furulund (SE); Magnus Birch, Svedala (SE)

(73) Assignee: Axis AB, Lund (SE)

( * ) Notice: Subject to any disclaimer, the term of this patent is extended or adjusted under 35 U.S.C. 154(b) by 2 days.

(21) Appl. No.: 15/392,602

(22) Filed: Dec. 28, 2016

(65) Prior Publication Data

US 2017/0188450 A1 Jun. 29, 2017

(30) Foreign Application Priority Data

Dec. 29, 2015 (EP) .................................... 15202978

(51) Int. Cl.
*H05K 1/00* (2006.01)
*H05K 1/02* (2006.01)
(Continued)

(52) U.S. Cl.
CPC ............ *H05K 1/0215* (2013.01); *H01R 4/40* (2013.01); *H01R 13/648* (2013.01);
(Continued)

(58) Field of Classification Search
CPC ............ H01R 13/648; H01R 13/6485; H01R 13/65802; H01R 13/6596; H01R 4/30;
(Continued)

(56) References Cited

U.S. PATENT DOCUMENTS 2,854,552 A * 9/1958 Gouverneur ........... H05K 3/222
200/243
5,165,533 A 11/1992 Wilentchik et al.
(Continued)

FOREIGN PATENT DOCUMENTS

EP 0219570 A1 4/1987
JP 2011061331 A 3/2011

OTHER PUBLICATIONS

Extended European Search Report issued in corresponding EP Application No. 15202978.1, dated May 3, 2016, 6 pages.

*Primary Examiner* — Pete T Lee
(74) *Attorney, Agent, or Firm* — Snyder, Clark, Lesch & Chung, LLP

(57) ABSTRACT

The present invention relates to a ground terminal for an electronic device. The ground terminal comprises a ground cable connecting device, an electrical switch, an electrical conductor connecting the ground cable connecting device to the electrical switch. The ground terminal and its ground cable connecting device is configured so that the electrical switch is brought in to a first mode in response to an electrical wire being connected to the ground cable connecting device, the first mode being a mode in which the switch establish electrical conduction between an electrical circuit of the electronic device and the ground cable connecting device. Moreover, the ground terminal and its ground cable connecting device is configured so that the electrical switch is in a second mode when no electrical wire is connected to the ground cable connecting device, the second mode being a mode in which the switch is electrically isolating the electrical circuit of the electronic device and the ground cable connecting device from each other.

17 Claims, 4 Drawing Sheets

(51) Int. Cl.
*H01R 4/40* (2006.01)
*H05K 5/02* (2006.01)
*H01R 13/648* (2006.01)
*H01R 13/703* (2006.01)
*H01R 4/34* (2006.01)
*H01R 4/64* (2006.01)
*H01R 11/28* (2006.01)

(52) U.S. Cl.
CPC ....... *H01R 13/7031* (2013.01); *H05K 5/0247* (2013.01); *H01R 4/34* (2013.01); *H01R 4/64* (2013.01); *H01R 11/28* (2013.01)

(58) Field of Classification Search
CPC .... H01R 9/0512; H01R 4/40; H01R 13/7031; H01R 4/34; H01R 4/64; H01R 11/28; H05K 1/0215; H05K 5/0247
See application file for complete search history.

(56) References Cited

U.S. PATENT DOCUMENTS

| | | | |
|---|---|---|---|
| 5,697,797 A * | 12/1997 | Wendel | H01Q 1/1214 411/342 |
| 6,527,598 B1 | 3/2003 | Opel | |
| 6,991,478 B2 * | 1/2006 | Girinon | B64D 45/02 439/92 |
| 7,088,564 B1 | 8/2006 | Chaudhry | |
| 8,159,833 B2 * | 4/2012 | Ishii | H05K 1/0215 174/262 |
| 2007/0270002 A1* | 11/2007 | Braden | H01R 4/646 439/92 |
| 2010/0059246 A1 | 3/2010 | Wakileh et al. | |
| 2015/0311601 A1* | 10/2015 | Boyer | H01R 4/64 439/92 |

\* cited by examiner

GROUND TERMINAL FOR AN ELECTRONIC DEVICE

RELATED APPLICATION

This application claims the benefit of European Application No. 15202978.1 filed Dec. 29, 2015, which is incorporated by reference herein.

TECHNICAL FIELD OF THE INVENTION

The present invention relates to personal safety for persons that may come in contact with electrical devices and in particular it relates to a ground terminal for an electrical device and to an electrical device.

BACKGROUND OF THE INVENTION

Electrical products of today are required to provide acceptable protection for users and other people who are handling the electrical device or simply who are at risk for being exposed to electrically conducting parts which accidentally may be live. A common way of protecting people from getting hurt in this situations is to have the electrically conducting part connected to ground. Thereby a circuit breaker, a residual-current Device (RCD), or a Ground Fault Circuit Interrupter (GFCI) will be able to switch off the electric circuit, because of the ground connection, when the electrical conducting part becomes live. Another way to protect people from parts of device that may be electrified is to provide sufficient electrical isolation between electrically live parts and parts that people may touch when the device is in use. Many electrical devices are provided with protective ground via the mains power supply. However in networked devices the trend is to power the networked device using Power Over Ethernet (POE) and in order to provide protective earth the network cable must provide the protective earth. This is usually provided in the shield.

Accordingly, if the user connect a networked electrical device using a cable without protective earth then no protective earth is provided. If the electric device is to be protected against electrical surges, the device may be equipped with an electric surge protecting device too. However, such a device require a ground connection and in many cases devices including electric surge protecting devices are provided with a separate ground cable. A device that is equipped with protective earth via a separate ground cable may be considered safe even if the electric device is connected to the network using a non-shielded network cable, thereby lacking the ground connection via the network cable. Some networked devices, e.g. monitoring cameras may be installed outdoors as well as indoors. If the device is installed outdoors the camera is recommended to be connected to a separate ground cable via a surge protector and a ground terminal connected to the housing of the electrical device. The surge protector is mainly included to protect the device against current surges, e.g. from lightning strikes, and is relying on sufficient electrical grounding of the surge protector.

Regarding the personal protection aspect, many electrical devices have metal housing which easily may become hazardous for a person handling the electric device. However if the device is connected to a separate ground cable it does not matter if the network cable have a ground connection as the electrical device and its housing is connected to ground via the separate ground cable.

If the networked electronic device is installed indoors, the separate ground cable is not usually corrected to the ground terminal and the housing of the electrical device as there are less risk for the need of the services of a surge protector. This is not a problem as long as the network cable includes a wire connected to ground and to the housing of the device. However, if a network cable with no protective earth is connected to the device and the ground connections of the networked electric device still is connected to the electrically conducting housing via the ground terminal, then the electronics of the electric device is directly connected to the housing which is without any connection to protective earth. This is potentially a dangerous situation for users handling the electronic device. The situation may be solved by isolating the ground connections in the electronic device from the housing. However, then the person installing the device or another person operating the device has to make sure that every time a ground cable for surge protection is connected to the electronic device an electrical insulation arranged between the electronics of the electric device and the ground terminal is removed. Alternatively, if there is no ground connected to the housing such electrical insulation has to be inserted between the electronics of the electric device and the housing of the electric device. Another option is to say that the device only is allowed to be used with a network cable having a protective earth line.

Anyhow, the problem is that there are too many risk scenarios leading to the electric device becoming an electrical hazard to a person handling it. Even if you require that a safety protocol is followed the situation will not be risk free. For instance, ponder the situation where a ground cable is not connected and the installer forgets to isolate the interior to the housing. Then the electrical safety relies on the network cable having the protective earth, but even if the person installing the device followed the protocol and used a grounded network cable, someone may exchange the original cable to a cable without a protective earth at any time. Accordingly reliable electrical safety for users are a problem.

SUMMARY OF THE INVENTION

One object of the present invention is to increase the reliability of personal protection and electrical safety in electric devices.

According to one aspect, these and other objects are achieved, in full or at least in part by a ground terminal for an electronic device comprises a ground cable connecting device, an electrical switch, and an electrical conductor connecting the ground cable connecting device to the electrical switch. The ground terminal and its ground cable connecting device is configured so that the electrical switch is brought in to a first mode in response to an electrical wire being connected to the ground cable connecting device, the first mode being a mode in which the switch establish electrical conduction between an electrical circuit of the electronic device and the ground cable connecting device. Moreover, the ground terminal and its ground cable connecting device is configured so that the electrical switch is in a second mode when no electrical wire is connected to the ground cable connecting device, the second mode being a mode in which the switch is electrically isolating the electrical circuit of the electronic device and the ground cable connecting device from each other. An advantage of arranging the ground cable connecting device for contact with the electrical circuit of the electrical device when a cable is connected to the ground cable connecting device is that the electrical device becomes less prone to become an electrical hazard for users in the vicinity. The risk of the ground cable connecting device being connected to the electrical circuit of the electrical device when no ground cable is connected to the ground cable connecting device and the ground terminal is decreased. One of the reasons for this is that the chance of a person installing the electrical device forgetting to either electrically isolate the ground terminal from the electric circuit of the electrical device when no ground cable is connected or electrically connect the ground terminal to the electrical circuit of the electrical device when a ground cable is connected is very small due to the specific arrangement.

According to some embodiments the ground cable connecting device includes a connecting surface, the ground cable connecting device is configured to make the connecting surface exert a clamping force on the electrical wire or a connecting means of the electrical wire. Further, the ground cable connecting device is mechanically connected to the electrical switch. This mechanical connection is configured to bring the electrical switch into the first mode when a movement, in the direction of the clamping force, of the connecting surface and the mechanical connection to the electrical switch is stopped by the electrical wire or the connecting means of the electrical wire pressing against the connecting surface. The advantage of bringing the switch over to the first mode, i.e. bringing the ground cable connecting device in contact with the electrical circuit of the electrical device, in response to the cable, e.g. a ground cable, being clamped by the ground cable connecting device is that the it is easier for the person installing the electrical device to accomplish an electrically safe installation. This results from the connection to the electrical circuit of the electrical device from the ground cable connector being achieved as a result of clamping the cable by the ground cable connecting device, i.e. achieving the connections in one operation. Thereby making it difficult for the person installing the electrical device to only set one of the connections and thereby having an electrical device that is potentially more dangerous than an electrical device where no action has been taken at all.

Further, the ground terminal may include a rod which at one end have an increased width forming the ground cable connecting device. Moreover, an electrical device including a ground terminal according to any of the above descriptions may include a housing which is electrically conducting and wherein the ground cable connecting device is electrically connected to the housing.

In some embodiments the electrical device having a ground terminal according to any of the descriptions above may include a housing and the ground terminal may be arranged through an opening in the hosing of the electrical device. Further, the ground cable connecting means may be configured to seal this opening independent of whether the ground terminal is connected to the ground cable or not. One advantage of an embodiment like this is that the electrical device may be sealed off from the surroundings even if the housing is penetrated by the ground terminal which is arranged to manoeuvring the switching between the two modes discussed above.

Further, the electrical device may include a housing and the housing may include a slot for reception of the increased width of the ground cable connection device.

According to yet other embodiments the electrical device having a ground terminal may include a housing, and the threads are formed on a first portion of the rod of the ground terminal and on a second portion of the rod of the ground terminal. The housing may include an opening for reception of the rod of the ground terminal and a thread configured to engage with the threads of the second portion of the rod. The first portion of the rod may be situated at a distal end of the rod in relation to the ground cable connecting device. The electrical switch may include an opening for reception of the rod of the ground terminal and the opening may include a thread configured to engage with the threads of the first portion of the rod. This design allow for performing the connecting of the cable to the ground terminal and the connecting of the ground cable connecting device to the electrical circuit of the electrical device in one simultaneous operation.

Further, the electrical circuit of the electronic device may include a printed circuit board (PCB). The PCB may include a ground connection area being a conducting area of the PCB which area is connected to circuits of the PCB that may be connected to ground. The electrical switch may include a contact surface configured to interact with the ground connection area of the PCB for electrical connection between the ground connecting area and the ground terminal when the switch is brought into the first mode.

Further yet, the switch may be configured to be brought into the first mode by interaction between the threads of the electrical switch and the threads of the first portion of the rod. The advantage of this feature is that it enables the switch to be brought into first mode by the operation of clamping a cable by means of the ground cable connecting device.

According to some embodiments of the electrical device the threads of the first portion of the rod are formed at a distance from the treads of the second portion of the rod in the axial direction of the rod so that the threads of the second portion do not engage with the threads of the opening in the housing until the threads of the first portion of the rod has passed through the opening of the electrical switch and is positioned on the side of the electrical switch not facing the ground cable connection device. The advantage of this arrangement is that the connecting of the ground cable connecting device and thereby the ground terminal to the electrical circuitry of the electrical device may be prohibited even if the ground terminal is removed and then reinserted.

Further, the threads of the second portion may be arranged at a position along the axis of the rod so that the threads of the second portion is hindered from interacting with the threads of the opening in the housing when a ground cable is connected to the ground cable connecting device. Thereby, the dual simultaneous connection of the ground cable and the electrical circuitry of the electrical device to the ground terminal may be achieved in one operation, According to some embodiments the threads of the first portion is arranged at a distance from the ground cable connecting device that enables the threads of the first portion to interact with the threads of the electrical switch and to through this interaction make the contact surface of the electrical switch move into electrical contact with the ground connection area of the PCB.

According to additional embodiments the electrical device further includes a force exerting device configured to exert a force on the switch that drives the contact surface of the switch in a direction away from the ground connection area of the PCB. The advantage of this is that a sufficient electrical isolation may be achieved between the ground terminal and the electrical circuit of the electrical device when no cable is connected to the ground terminal.

Moreover, the force exerting device may be any device from the group of a compression spring, a tension spring, or a torsion spring.

According to some embodiments the ground cable connecting device includes a second portion of further increased width arranged closer to the end of the ground terminal.

A further scope of applicability of the present invention will become apparent from the detailed description given below. However, it should be understood that the detailed description and specific examples, while indicating preferred embodiments of the invention, are given by way of illustration only, since various changes and modifications within the scope of the invention will become apparent to those skilled in the art from this detailed description. Hence, it is to he understood that this invention is not limited to the particular component parts of the device described or steps of the methods described as such device and method may vary. It is also to be understood that the terminology used herein is for purpose of describing particular embodiments only, and is not intended to be limiting. It must be noted that, as used in the specification and the appended claim, the articles "a," "an," "the," and "said" are intended to mean that there are one or more of the elements unless the context clearly dictates otherwise. Thus, for example, reference to "a sensor" or "the sensor" may include several sensors, and the like. Furthermore, the word "comprising" does not exclude other elements or steps.

BRIEF DESCRIPTION OF THE DRAWINGS

Other features and advantages of the present invention will become apparent from the following detailed description of a presently preferred embodiment, with reference to the accompanying drawings, in which.

Further, in the figures like reference characters designate like or corresponding parts throughout the several figures.

DETAILED DESCRIPTION OF EMBODIMENTS

Figure 1:
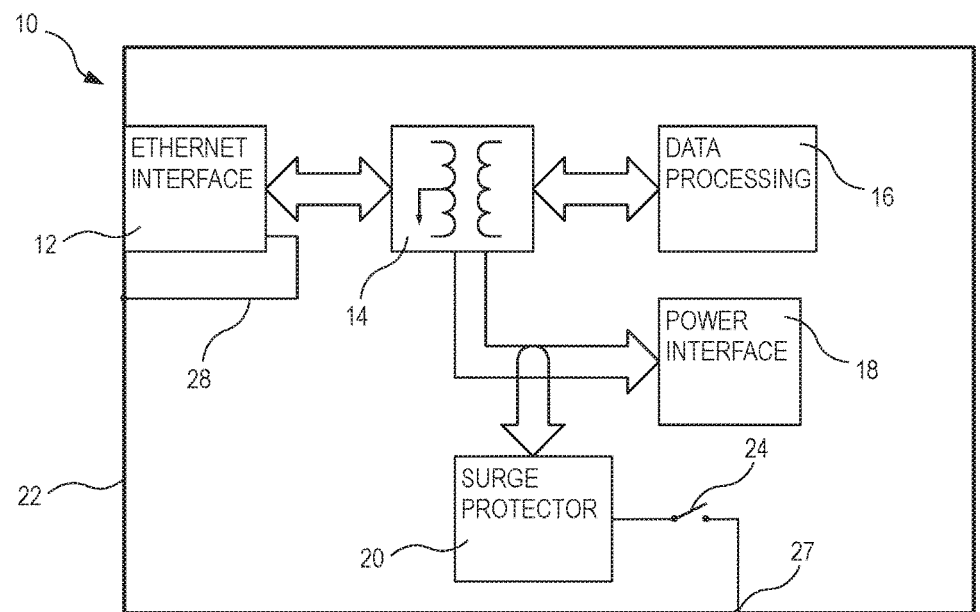
FIG. 1 is a schematic block diagram of an electric device implementing embodiments of the present invention.

The present invention relates to personal protection from electrically live parts of electrical devices and especially electrical devices that is powered using Power Over Ethernet, POE. An example of an electrical device in which embodiments of the invention may be implemented is shown in FIG. 1. The electrical device 10 may be any type of electrical device communicating data via an Ethernet interface 12 to a computer network. The electrical device 10 comprises a data and power separation circuit 14, data processing means 16, a power interface 18 providing power to the electrical device 10, a surge protector 20, a housing 22, an electrical switch 24 configured to alternately connect and disconnect the ground of electrical circuitry in the electrical device 10, e.g. a common ground in the electrical device 10, to and from a ground cable 26 or a ground wire 26, The ground cable 26 is connected to the electrical device and the housing of the electrical device at a ground terminal connection point 27.

The Ethernet interface includes an interface connector 28 or connectors dedicated for being connected to a ground connection in a cable that is connected to the interface. This ground connection interface connector 28 is electrically connected to the housing of the electrical device 10. However, the housing will only be connected to the ground potential via. the Ethernet cable if the Ethernet cable used is designed to carry ground lines, i.e. if the cable have one or a plurality of lines intended for connecting to ground potential. These ground lines are commonly implemented as shields in the cable and is having the main purpose of shielding the communication lines in the cable from electromagnetic interference. However, a ground connection may also prevent an electrical device from becoming an electric hazard for persons that are in physical contact with it. For instance, if the housing of an electric device receives a hazardous electrical potential due to electrical failure in the electrical device, the fact that the housing is connected to earth will make the housing and the ground line in the Ethernet cable part of an electrical circuit drawing current. This current will be large enough to make a Ground Fault Circuit Interrupter (GFCI), a residual-current Device (RCD), a fuse, or a circuit breaker to disconnect the electric device 10 from the power source. These devices may be arranged in the power delivery system or in the electrical device 10. This result is also achieved if a separate ground cable 26 is connected to the housing.

An electrical device as discussed in this specification may be arranged outdoors or indoors. The requirements on electrical devices are different for an electrical device arranged indoors than for an electrical device arranged outdoors. However, in order to be allowed to be arranged outdoors and be susceptible to the outdoor elements the device may be required to include surge protection in order to be able to manage electrical surges introduced by for example lightning strikes nearby. The surge protection of the electric device have to include a dedicated wire or ground cable 26 that is connecting the housing and the surge protector to ground potential. The surge protector and the housing is connected to the ground system of the electric device.

When the electrical device is used indoors there is no need to connect the dedicated ground cable 26 as described above and hence the housing and the surge protector will be connected to the ground system of the electrical device. This may be a problem if no other ground connection is provided to the housing as the housing may be at a risk of carrying a hazardous electrical potential. One solution to the problem is to provide a ground connection to the electric device and the housing by, for example, using a shielded Ethernet cable. An alternative solution is to provide adequate electrical insulation between the electric circuits of the electrical device and the housing.

Embodiments of the invention are designed to provide the electrical insulation by introducing the switch 24 between the ground system of the electrical device, in FIG. 1 shown as a connection to the surge protector 20, and the housing 22. The switch is arranged to be set in a first mode for providing electrical contact between the ground system of the electrical device and a ground cable connecting device, e.g. the ground terminal connection point 27, as well as the housing and in a second mode for breaking the same connection. In the second mode the switch may provide adequate electric insulation between the electric circuitry of the electric device and the housing.

Figure 2:
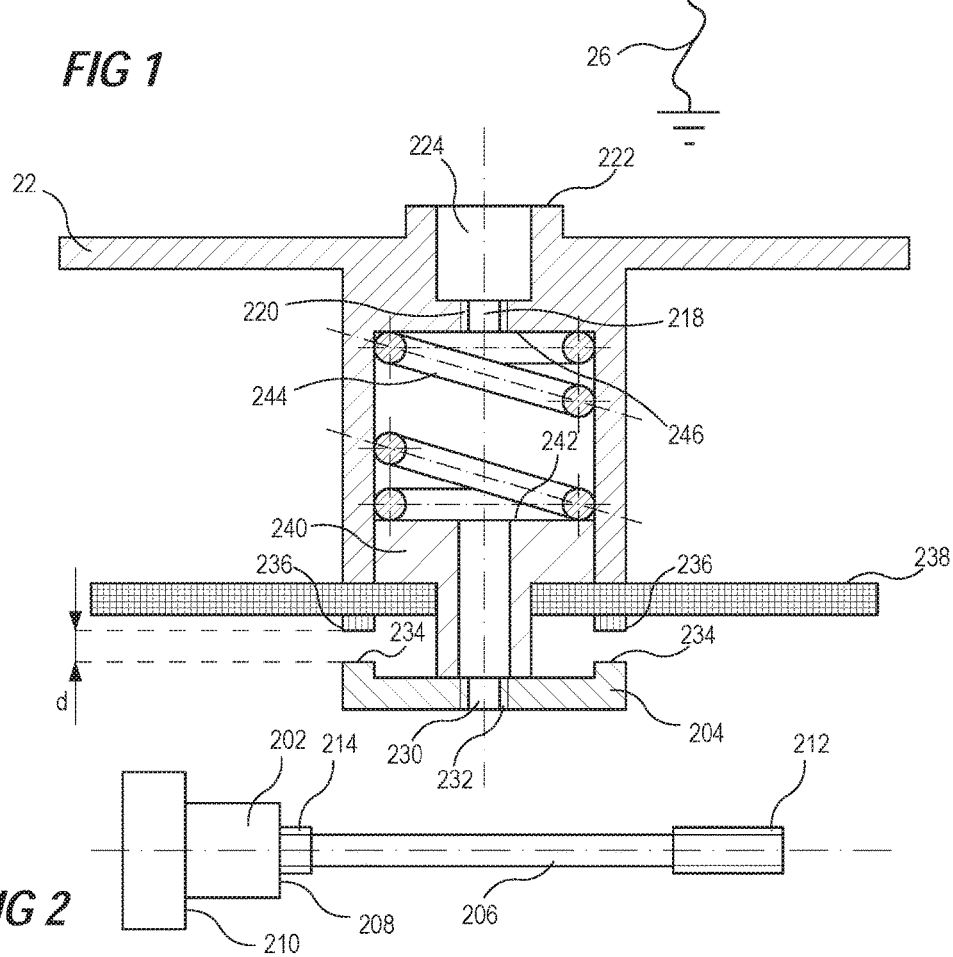
FIG. 2 is a schematic diagram of a ground terminal and parts of an electrical device according to some embodiments of the invention.

Now referring to FIG. 2, according to some embodiments a ground terminal includes a ground cable connecting device 202, this function is referred to as ground terminal connection point 27, an electrical switch 204, this function is referred to as electrical switch 24 in FIG. 1, and an electrical conductor 206. In the example the electrical conductor 206 and the ground cable connecting device 202 are implemented as a single unit in which the electrical conductor 206 is a rod of conducting material and the ground cable connecting device is formed at one end of the rod as a "head", i.e. as an increased diameter of the rod. The head may be formed as a portion of the rod having increased width in relation to the rod, instead of increased diameter, i.e. the head is not necessary cylindrical in shape but may have a square, triangular, or any other shape to its cross section transversal to a longitudinal direction of the rod 206.

In some embodiments the ground cable connecting device 202 includes a ground cable connecting surface 208 which is arranged to exert a clamping force on a ground cable 26, which may or may not be equipped with a connecting means, e.g. a cable shoe, being positioned and thereby pressed between the ground cable connecting surface 208 and the housing 22 of the electrical device. Further the ground cable connecting device 202 includes a sealing surface 210 arranged to form a seal between the housing 22 and the ground cable connecting device. Moreover, threads 212, 214, are arranged on the rod 206. A first portion of the rod 206 being distal to the ground cable connecting device 202 is provided with a first set of threads 212. A second portion of the rod 206 being proximal to the ground cable connecting device 202 is provided with a second set of threads 214.

The housing 22 of the electrical device 10 have an opening 218 for receiving the rod 206. In the example of FIG. 2 the opening is provided with threads 220 intended to interact with the threads of the second set of threads 214 on the rod 206 in order to enable tightening of the sealing surface 210 of the ground cable connecting device against a housing sealing surface 222 when no ground cable 26 is connected to the ground cable connecting device 202. In order to enable engagement of the second set of threads 214 and the threads 220 of the opening 218 the portion of the rod that has increased diameter and is being part of the ground cable connecting device and is forming the ground cable connecting surface 208 is to be received in a slot 224 in the housing 22. When a ground cable 26 is arranged to interact with the ground cable connecting surface 208 and which therefore is clamped between the ground cable connecting surface 208 and the housing 22 and the housing sealing surface 222 then the ground cable 26 or its connecting means, e.g. cable shoe, seals the opening 218 and there is no interaction between the second set of threads 214 and the threads 22.0 of the opening 218.

The switch 204 also includes an opening 230 arranged to receive the rod 206. This opening is also provided with threads 232. The threads 232 of the switch 204 is arranged to engage with the first set of threads 212 of the rod 206. The switch is made from an electrically conducting material and includes a contact area 234 arranged to be brought into contact with a conducting area 236 of a printed circuit board 238 (PCB) which is carrying components and wiring included in an electric circuit of the electric device. The conducting area 236 is connected to a ground system of the electric device 10, i.e. a ground connecting area 236. When the switch contact area 234 is in contact with the PCB conducting area 236 the switch 204 is in the first mode, as mentioned above. The switch 204 is in the second mode, mentioned previously, when sufficient electrical isolation between the switch contact area 234 and the PCB conducting area 236 is provided. The amount referred to by the term "sufficient isolation" may vary depending on the requirements for the electric device. In the present example the isolation is provided by means of arranging an airgap between the switch contact area 234 and the PCB conducting area. 236. The level of electrical isolation depends on the distance d between the two conducting surfaces 234, 236. In some embodiments the typical "sufficient" electrical isolation is achieved by means of arranging an airgap positioning the two surfaces at a distance d from each other of at least 2.0 mm. The level of sufficient electrical insulation and electrical isolation may depend on the application. However, other distances may be used in accordance with the standard IEC 60950-1 "Information technology equipment—Safety".

Moreover, the example embodiment of FIG. 2 includes a guiding device 240 which may be made of any electrical insulating material or may be arranged riot to conduct electricity to the housing or the PCB. The guiding device 240 is physically attached to the switch 204 and is arranged to guide the switch 204 to perform a movement in the longitudinal direction of the rod 206 when the first set of threads 212 of the rod 206 interacts with the threads 232 of the switch 204. Further, an end 242 of the guiding device, which is on the opposite side of the guiding device in relation to the end attached to the switch 204, is subjected to a force directed along the longitudinal direction of the rod 206 and in a direction pushing the contact surface 234 of the switch 204 away from the ground connection area 236 of the PCB 238. In this particular example it also means that the force is driving the switch 204 away from the PCB 238. A force exerting device 244 such as a compression spring, a tension spring, a torsion spring, etc. is arranged to exercise a force on the end 242 of the guide 240 which is opposite to the switch 204. In the example of FIG. 2 the force exerting device 244 is a compression spring arranged between the end 242 of the guide 240 and an inner wall 246 of the housing 22. The main purpose of the force exerting device 244 is to make sure that the electrically isolating gap d between the contact surface 234 of the switch 204 and the PCB conducting area 236 is formed when no other force is acting on the switch in the opposite direction.

In some embodiments the opening 218 in the housing may have a larger diameter than the diameter of the opening 230 in order to facilitate inserting of the rod 206 into the housing and enable engagement with the switch 204. Accordingly, in such embodiments the diameter of the rod at the first set of threads 212 should be smaller than the diameter at the second set of threads 214. The difference in size may only need to be subtle for simplifying the insertion of the rod.

Figure 3:
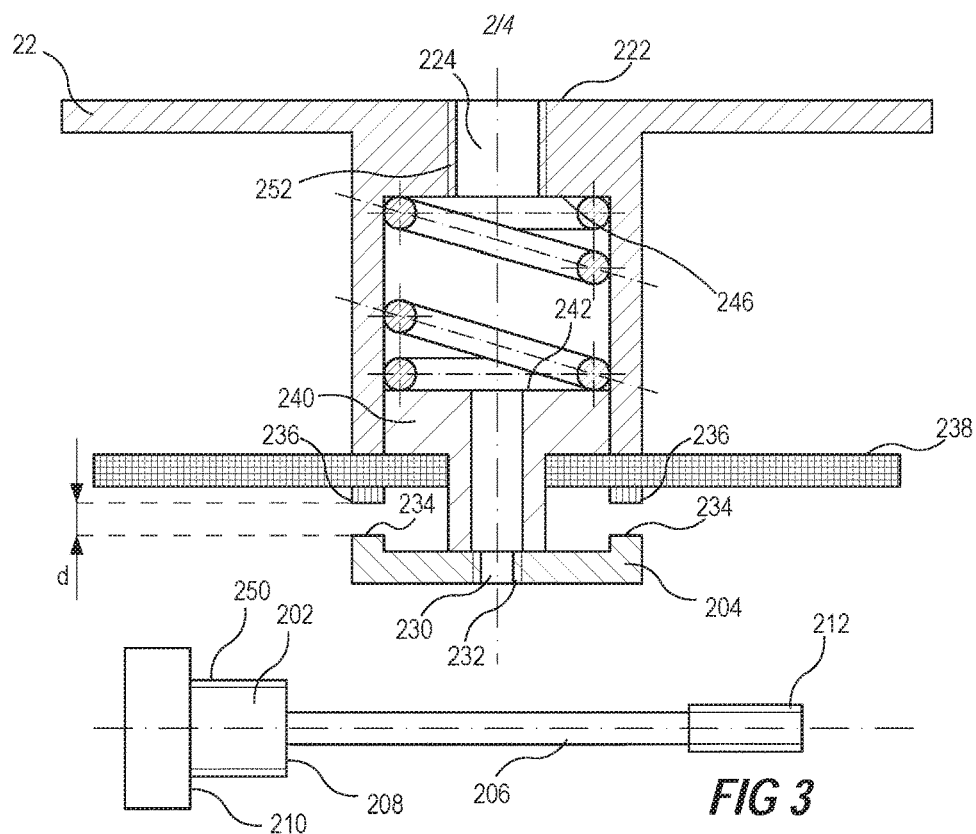
FIG. 3 is a schematic diagram of a ground terminal and parts of an electrical device according to alternative embodiments of the invention.

In FIG. 3 an alternative embodiment is shown. The design of this ground terminal and the interacting portion of the housing 22 is almost identical to the one described in connection with FIG. 2. The main differences between the design in FIG. 3 and the design in FIG. 2 are that the second set of threads 250, which is on the rod 206 on the embodiment of FIG. 2, now is arranged on the increased width portion being a part of the ground cable connecting device 202. Correspondingly the slot 224 arranged in the housing 22 of the electronic device 10 is provided with a set of threads 252 for interaction with the set of threads 250 on the ground cable connecting device 202. The design facilitate the initial insertion of the rod into the ground terminal opening of the housing in order to screw the rod 206 into the switch 204. Moreover the manufacturing becomes somewhat easier as the design is simpler.

Figure 4A:
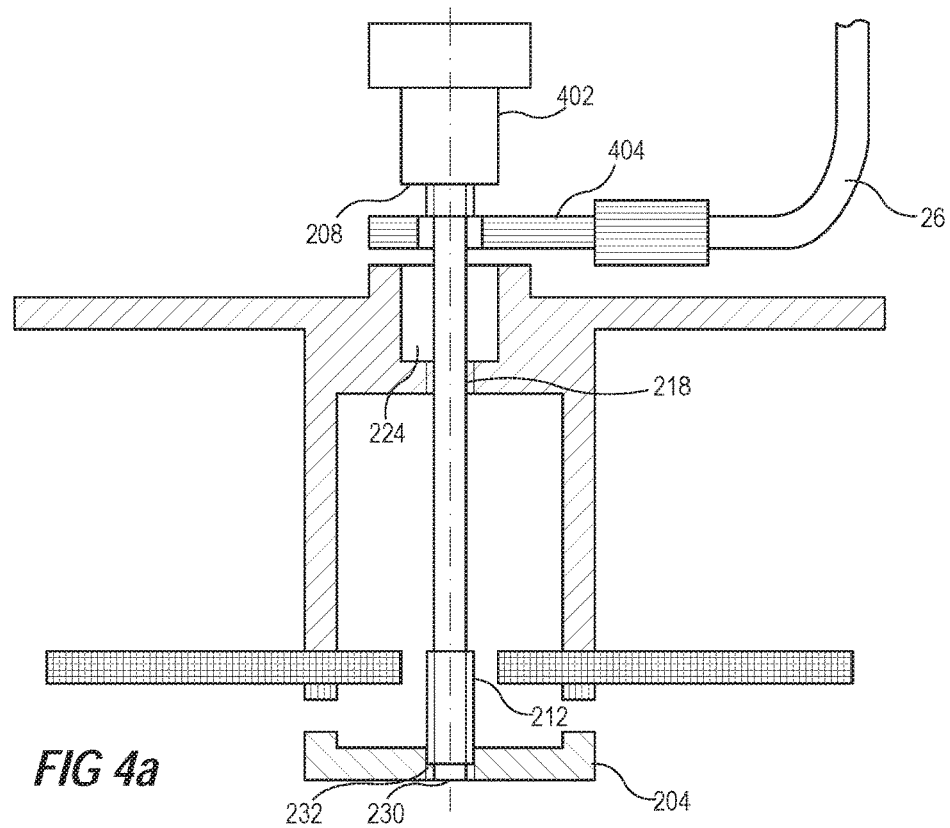
FIG. 4a-c is schematic diagrams of the ground terminal and parts of the electrical device of FIG. 2 and how parts of the ground terminal, the housing of the electric device, the electrical circuitry of the electric device and the ground cable interacts when the ground cable and the electrical circuitry is connected to the ground terminal in one operation.
Figure 4B:
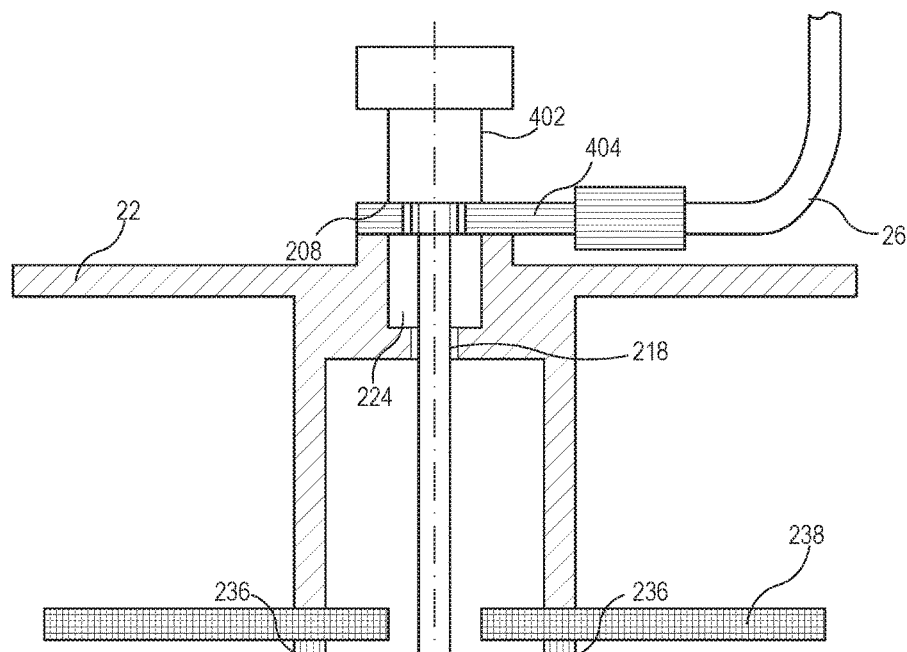
Figure 4C:
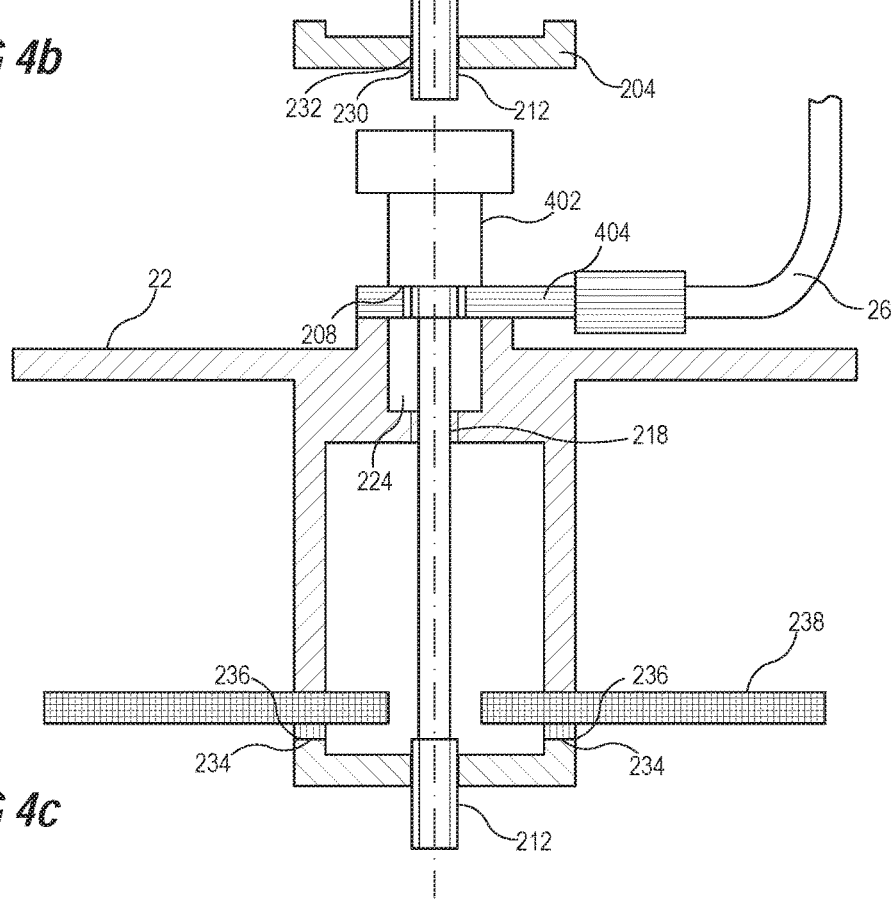

Now referring to FIGS. 4a-c and in order to facilitate understanding of the following description the combination of the ground cable connecting device 202 and the rod 206 will be referred to as the ground terminal bolt 402. The series of figures, i.e. FIGS. 4a-c, is showing the operation of the ground terminal for the electrical device when a ground cable 26 is to be connected to it. FIGS. 4a-c depicts the same device as depicted in FIG. 2, hence the reference numerals of FIG. 2 also applies in FIGS. 4a-c even if not all reference numerals are presented in these figures in order to facilitate the reading of these figures. In FIG. 4a the ground terminal bolt 402 is inserted through the opening 218 in the housing and a cable shoe 404 connected to the ground cable 26 is around the rod 206 of the ground terminal bolt 402. The ground terminal bolt 402 is inserted all the way until the end of the ground terminal bolt 402 having the first set of threads 212 reaches the threads 232 of the opening 230 in the switch 204. As seen in FIG. 4b the first wider portion of the ground terminal bolt 402 which forms the ground cable connecting surface 208 is hindered from entering the slot 224 of the housing 22 by the cable shoe 404. Alternatively, the wider portion of the ground terminal bolt 402 is hindered to enter the slot of the housing 224 by the cable itself or a cable connecting device. Then, when the ground terminal bolt 402 is turned and the first set of threads 212 of the ground terminal bolt engages with the threads 232 of the opening 230 in the switch 204 resulting in the switch 204 moving towards the PCB conducting area 236 to be connected to ground. The force provided to the switch via the threads 212, 232, is greater than the force from the force exerting element, shown in FIGS. 2 and 3, forcing the switch away from the PCB conducting area 236.

The ground terminal bolt is then continued to be turned until the contact surface 234 of the switch is in electrical contact with the PCB conducting area 236, as shown in FIG. 4c. Then the ground terminal bolt is continued to be turned in order to ensure that the cable shoe 404 is secured and is forming an adequate electrical connection with the ground cable connecting device 202, via the ground cable connecting surface 208, and with the housing 22 of the electrical device, via the housing sealing surface 222. Further, the force applied in securing the cable shoe 404 is also applied at the contact between the contact surface 234 of the switch and the PCB conducting area 236 which also ensures adequate electrical connection between the PCB contact area 236 and the ground terminal bolt 402. Accordingly, the PCB 238 has become electrically connected to the ground cable 206.

Figure 5A:
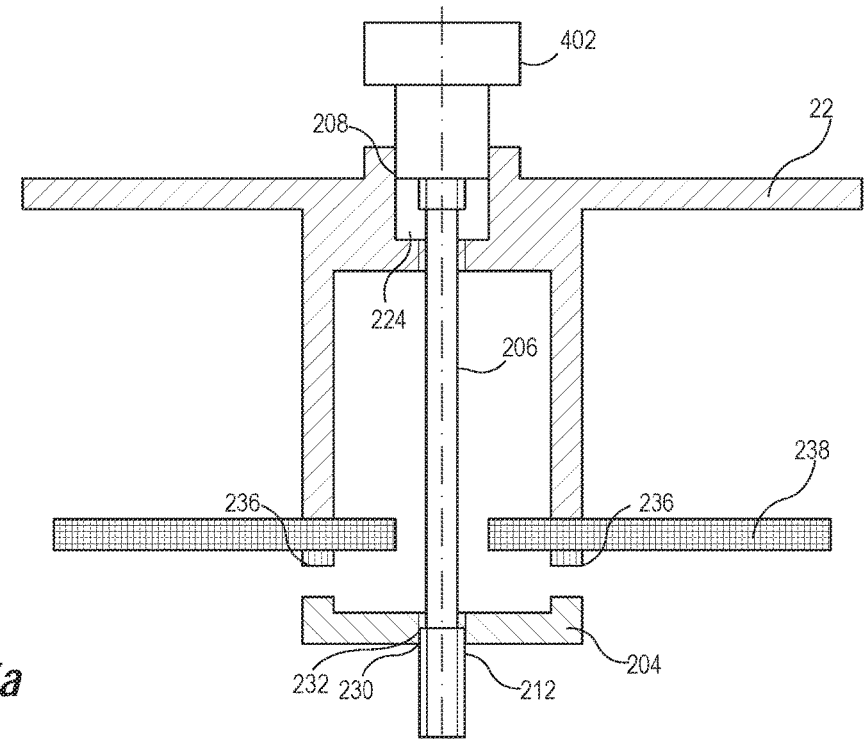
FIG. 5a-b is schematic diagrams of the ground terminal and parts of the electrical device of FIG. 2 and how parts of the ground terminal, and the housing of the electric device interacts when electrical isolation is to be achieved due to no ground cable being connected to the ground terminal.
Figure 5B:
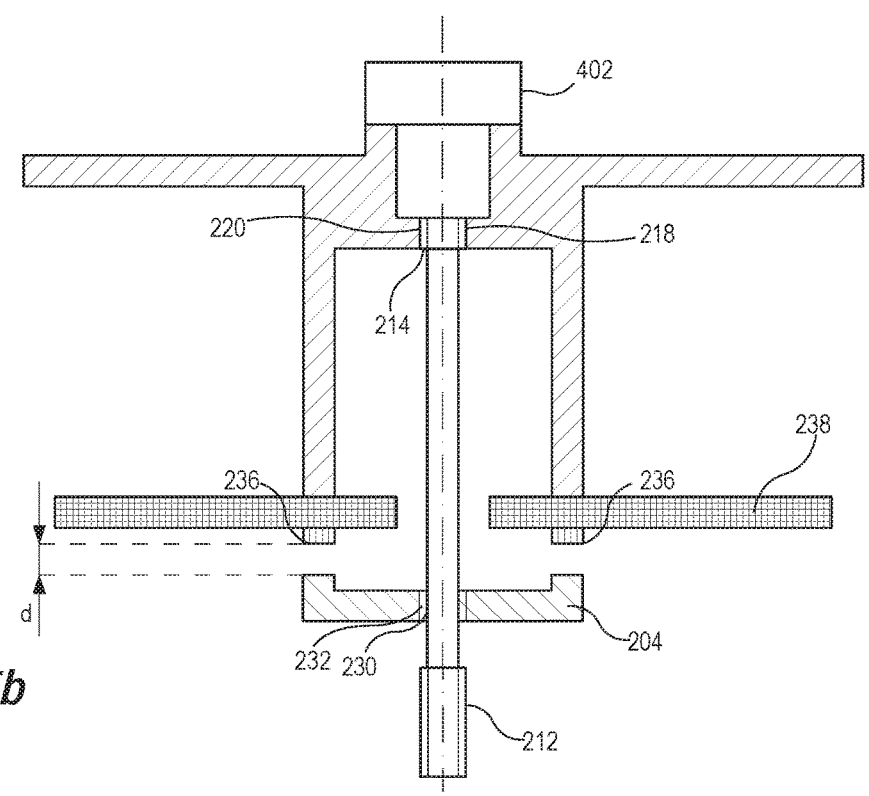

Now referring to FIGS. 5a-5b, in which a ground terminal bolt 402 is fastened to the electrical device without connecting a ground cable 206 and simultaneously electrically isolating the PCB 238 from the housing 22. FIGS. 5a-b depicts the same device as depicted in FIG. 2, hence the reference numerals of FIG. 2 also applies in FIGS. 5a-b even if not all reference numerals are presented in these figures in order to facilitate the reading of these figures. As seen in FIG. 5a, the first set of threads 212 of the rod 206 of the ground terminal bolt 402 is engaging with the threads 232 of the opening 230 in the switch in the same way as in the case where a cable shoe 404 was to be connected and fixed by the ground cable connecting device 202. However, in this case there is no cable shoe hindering the first wider portion of the ground terminal bolt 402, which forms the ground cable connecting surface 208, from entering the slot 224 of the housing 22. Therefore, the ground terminal bolt 402 is now allowed to travel the distance within the slot and this extra allowed movement of the ground terminal bolt into the housing of the electrical device results in that the first set of threads 212 is threaded past the opening 230 of the switch 204.

When the first set of threads 212 of the ground terminal bolt has passed the switch, two things are accomplished, see FIG. 5b. For the first the force exertion device, shown in FIGS. 2 and 3, forces the contact surface 234 of the switch away from the PCB conducting area because there are no engagement between the first set of threads 212 and the threads 232 of the opening 230 in the switch any more. Hence, the force from the force exertion device is prevalent on the switch 204. Thereby is the isolating gap d between the contact surface 234 of the switch and the PCB conducting area 236 secured. Moreover, the second set of threads 214 of the ground terminal bolt 402 is engaging in the threads 220 of the opening 218 in the housing sealing the opening 218 and securing the ground terminal bolt 402 so that the ground terminal bolt cannot move and accidently alter the distance between the contact surface 234 of the switch and the PCB conducting area 236 and thereby jeopardizing the electrical insulation achieved by the air gap d.

Now referring to FIG. 4c, showing the electrical connection of the PCB conducting area to the ground cable 26. The electrical path from the PCB conducting area 236 to the ground cable 26 includes the contact surface 234 of the switch and the switch, which is made from electrical conducting material. Further, the electrical path includes the rod 206 of the ground terminal bolt 402. The rod 206 is electrically connected to the switch 204 via the first set of threads 212 of the rod 206 and the threads 232 of the switch 204. Moreover, the path includes the ground cable connecting device 202 and the ground cable connecting surface 208, which is clamping the ground cable 26 or its electrical connecting means 404 between the ground cable connecting surface 208 and the housing sealing surface 222 thereby electrically connecting the ground cable to the PCB conducting area 236 and to the housing 22.

The invention claimed is:

1. Ground terminal for an electronic device comprising: a ground cable connecting device, an electrical switch, and an electrical conductor to connect the ground cable connecting device to the electrical switch, wherein the ground terminal and the ground cable connecting device are configured so that the electrical switch is brought into a first mode in response to an electrical wire or an electrical wire connector being connected to the ground cable connecting device, the first mode being a mode in which the switch establishes electrical conduction between an electrical circuit of the electronic device and the ground cable connecting device, wherein the ground terminal and the ground cable connecting device are configured so that the electrical switch is in a second mode when no electrical wire or electrical wire connector is connected to the ground cable connecting device, the second mode being a mode in which the switch electrically isolates the electrical circuit of the electronic device and the ground cable connecting device from each other, wherein the ground cable connecting device includes a connecting surface, wherein the ground cable connecting device is configured to make the connecting surface exert a clamping force on the electrical wire or the electrical wire connector, wherein the ground cable connecting device is mechanically connected to the electrical switch, and wherein the mechanical connection is configured to bring the electrical switch into the first mode when a movement of the mechanical connection is stopped by the electrical wire or the electrical wire connector pressing against the connecting surface.

2. Ground terminal according to claim 1, further including a rod which at one end has an increased width forming the ground cable connecting device.

3. Electrical device including a ground terminal according to claim 1, wherein the electrical device includes a housing which is electrically conducting and wherein the ground cable connecting device is electrically connected to the housing.

4. Electrical device including a ground terminal according to claim 1, wherein the electrical device includes a housing and wherein the ground terminal is arranged through an opening in a housing of the electrical device and wherein the connecting means is configured to seal the opening independent of whether the ground terminal is connected to the ground cable.

5. Electrical device including a ground terminal according to claim 2, wherein the electrical device includes a housing, wherein the housing includes a slot for reception of the increased width of the ground cable connection device.

6. Electrical device including a ground terminal according to claim 2, wherein the electrical device includes a housing, and wherein threads are formed on a first portion of the rod and on a second portion of the rod, the housing includes an opening for reception of the rod of the ground terminal and a thread configured to engage with the threads of the second portion of the rod, the first portion of the rod is situated at a distal end of the rod in relation to the ground cable connecting device, and the electrical switch includes an opening for reception of the rod of the ground terminal, the opening includes a thread configured to engage with the threads of the first portion of the rod.

7. Electrical device according to claim 6, wherein the electrical circuit of the electronic device includes a printed circuit board, PCB, the PCB includes a ground connection area being a conducting area of the PCB, which area is connected to circuits of the PCB that are to be connected to ground, the electrical switch includes a contact surface configured to interact with the ground connection area of the PCB for electrical connection between the ground connecting area and the ground cable connecting device when the switch is brought into the first mode.

8. Electrical device according to claim 6, wherein the switch is configured to be brought into the first mode by interaction between the threads of the electrical switch and the threads of the first portion of the rod.

9. Electrical device according to claim 6, wherein the threads of the first portion of the rod are formed at a distance from the treads of the second portion of the rod in the axial direction of the rod so that the threads of the second portion do not engage with the threads of the opening in the housing until the threads of the first portion of the rod have passed through the opening of the electrical switch and are positioned on a side of the electrical switch not facing the ground cable connection device.

10. Electrical device according to claim 6, wherein the threads of the second portion are arranged at a position along an axis of the rod so that the threads of the second portion are hindered from interacting with the threads of the opening in the housing when a ground cable is connected to the ground cable connecting device.

11. Electrical device according to claim 7, wherein the threads of the first portion are arranged at a distance from the ground cable connecting device that enables the threads of the first portion to interact with the threads of the opening in the electrical switch and to through the interaction make the contact surface of the electrical switch move into electrical contact with the ground connection area of the PCB.

12. Electrical device according to claim 7, further including a force exerting device configured to exert a force on the switch that drives the contact surface of the switch in a direction away from the ground connection area of the PCB.

13. Electrical device according to claim 12, wherein the force exerting device is a compression spring, a tension spring, or a torsion spring.

14. Ground terminal according to claim 1, wherein the ground cable connecting device includes a second portion of further increased width arranged closer to an end of the ground terminal.

15. The ground terminal for the electronic device of claim 1, wherein the second mode is a mode in which electrical conduction exists between the ground cable connection device and the switch through the electrical conductor.

16. A device comprising: a housing to enclose circuits of the device; a ground wire connecting surface configured to exert a clamping force on a ground wire or ground wire connector and electrically connect to the ground wire or ground wire connector, wherein the ground wire connecting surface is accessible from outside the housing; a switch; a conductor to electrically connect the ground wire connecting surface to the switch, wherein, in a first mode. the switch is configured to electrically connect the conductor and the ground wire connecting surface to the circuits of the device when the g round wire or ground wire connector is connected to the ground wire connecting surface, wherein, in a second mode, the switch is configured to isolate the conductor and the ground wire connecting surface from the circuits of the device when the ground wire or ground wire connector is not connected to the ground wire connecting surface wherein the device is configured to make the ground wire connecting surface exert a clamping force on the ground wire or ground wire connector: wherein the connecting surface is mechanically connected to the switch, and wherein the mechanical connection is configured to bring the switch into the first mode when a movement of the mechanical connection is stopped by the ground wire or the ground wire connector pressing against the connecting surface.

17. The device of claim 16, wherein the switch is configured to electrically connect the conductor to the circuit in response to the ground wire being connected to the ground wire connecting surface.

\* \* \* \* \*